United States Patent
Corle et al.

Patent Number: 5,121,256
Date of Patent: Jun. 9, 1992

[54] LITHOGRAPHY SYSTEM EMPLOYING A SOLID IMMERSION LENS

[75] Inventors: Timothy R. Corle; Gordon S. Kino, both of Santa Clara County; Scott M. Mansfield, San Mateo County, all of Calif.

[73] Assignee: The Board of Trustees of the Leland Stanford Junior University, Stanford, Calif.

[21] Appl. No.: 669,200

[22] Filed: Mar. 14, 1991

[51] Int. Cl.$^5$ .............................. G02B 7/02
[52] U.S. Cl. .................... 359/664; 359/661; 359/508; 359/356; 250/492.2
[58] Field of Search .............. 359/661, 664, 819, 823, 359/234, 236, 508, 510, 356; 250/310, 492.2; 356/345

[56] References Cited

U.S. PATENT DOCUMENTS

| | | | |
|---|---|---|---|
| 3,556,659 | 1/1971 | Hawes | 359/664 |
| 4,634,234 | 1/1987 | Baumann | 359/661 |
| 5,032,011 | 7/1991 | Muchel | 359/664 |

Primary Examiner—Loha Ben
Attorney, Agent, or Firm—Flehr, Hohbach, Test, Albritton & Herbert

[57] ABSTRACT

A lithography system employing a solid immersion lens having a spherical surface to enhance its resolution is disclosed.

4 Claims, 4 Drawing Sheets

FIG.−5

LITHOGRAPHY SYSTEM EMPLOYING A SOLID IMMERSION LENS

BRIEF DESCRIPTION OF THE INVENTION

This invention relates generally to a lithography system and more particularly to a lithography system employing a solid immersion lens.

BACKGROUND OF THE INVENTION

The best known technique for near-field optical microscopy is to image through a pinhole that is smaller than the diffraction limited spot size. If the pinhole is placed very close to the object, the pinhole size essentially determines the definition. The fields decay rapidly after passing through the aperture, and for this reason the sample must be brought into close proximity with the pinhole. Near-field optical microscopes based on this principle have been demonstrated by Pohl and others. (See D. W. Pohl, W. Denk and M. Lanz, Appl.-Phys.Lett. 44 652 (1984); E. Betzig, M. Isaacson and A. Lewis, Appl.Phys.Lett. 51, 2088–2090 (1987)) In co-pending application Ser. No. 07/508,224 filed Apr. 12, 1990 assigned to a common assignee, there is described an optical microscope which includes a high refractive index solid immersion lens interposed between the objective lens and the sample being viewed to provide a microscope having improved resolution. By placing the solid immersion lens (SIL) in contact with or very close to the sample, it can be used for imaging in two modes: the near field mode and the internal imaging mode. These two modes are illustrated in FIGS. 1 and 2 which show a solid immersion lens 11 interposed between an objective lens 12 and a sample 13.

In its near-field mode of operation, illustrated in FIG. 1, the microscope uses both the evanescent fields just outside the flat surface of the SIL and fields that propagate in air to image objects placed close to the SIL. The propagating fields allow the system to be easily focused and the evanescent fields improve the resolution in air by a factor 1/n where n is the index of refraction of the solid immersion lens material. Thus, near-field operation of this kind makes it possible to partially circumvent diffraction effects which limit the transverse resolution of scanning confocal and standard optical microscopes to approximately a half wavelength in air.

In the internal imaging mode, an SIL is used which has the same refractive index as the medium being examined, and the SIL is placed in contact with or very close to the sample (FIG. 2). In this case, the beam may be focused into the interior of the sample without aberration, and a definition which depends on the wavelength inside the sample rather than that in air.

In optical lithography, there is a continuing need for improved definition in the transfer of patterns from a photomask to a photoresist used in the processing of semi-conductor devices such as integrated circuits. It is predicted that integrated circuits having line widths below 0.5 $\mu$m will be in volume production by the mid-nineteen nineties.

OBJECTS AND SUMMARY OF THE INVENTION

It is an object of the present invention to provide an improved optical lithography system.

It is another object of the present invention to provide a microlithography system employing a solid immersion lens.

The foregoing and other objects of the invention are achieved by a lithography system of the type which includes a lens system for focusing the image of a mask onto a sample in which a high refractive index solid immersion lens having a spherical surface facing the lens system and a flat front surface spaced from the spherical surface is placed with the flat surface closely adjacent to the sample.

BRIEF DESCRIPTION OF THE DRAWINGS

The foregoing and other objects of the invention will become apparent from the following description when read in conjunction with the accompanying drawings, in which.

DESCRIPTION OF A PREFERRED EMBODIMENT

Figure 3:
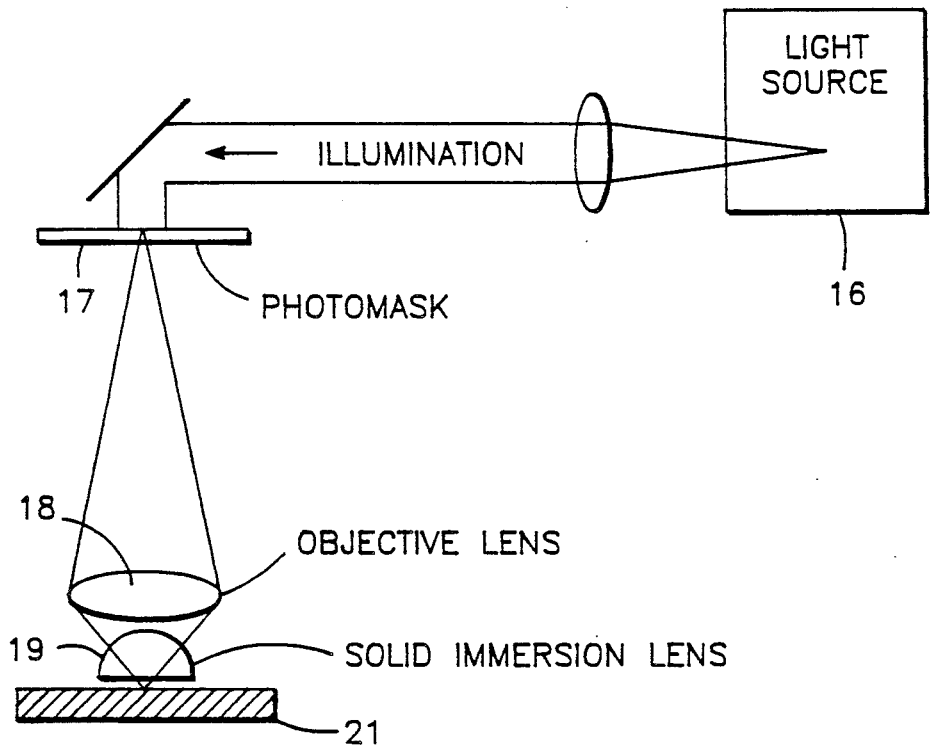
FIG. 3 is a simplified schematic diagram of a projection lithography system incorporating an SIL.

A simplified diagram of a lithography system incorporating an SIL in accordance with the present invention is shown in FIG. 3. In this system, an arc lamp or other light source 16 is used to uniformly illuminate a photomask 17. A microscope objective lens 18 with an SIL 19 is used to image the photomask onto the sample 21. A projection lithography lens/mirror system could easily be used in place of the microscope objective. The photomask is placed in the back image plane, or any other image plane, of the sample.

A common formula quoted for the resolution in an optical lithography system is $$R = \frac{k\lambda}{N.A.}$$

where $\lambda$ is the wavelength of light, N.A. is the numerical aperture of the lens, and "k" is a constant which includes many process parameters ("k" values of 0.8 are generally accepted by process engineers as achievable in manufacturing).

If an SIL is added to the imaging system, the effective wavelength is reduced by a factor of $\lambda/n_{SIL}$, where $n_{SIL}$ is the index of refraction of the material from which the solid immersion lens is made. Thus, the minimum resolution is reduced by a factor of $n_{SIL}$. For typical materials, $n_{SIL} = 2$–$2.5$ so that a microlithography system which was capable of 0.5 $\mu$m resolution will be capable of 0.2–0.25 $\mu$m resolution with an SIL.

One difficulty with using the SIL is that it must be placed very close to the sample in order to achieve the improved definition. The optical fields decrease in intensity very rapidly if the separation between the SIL and the sample is greater than 50 nm. To control the distance between the SIL and the sample, many of the techniques developed for proximity or soft contact microlithography machines can be used.

Figure 4:
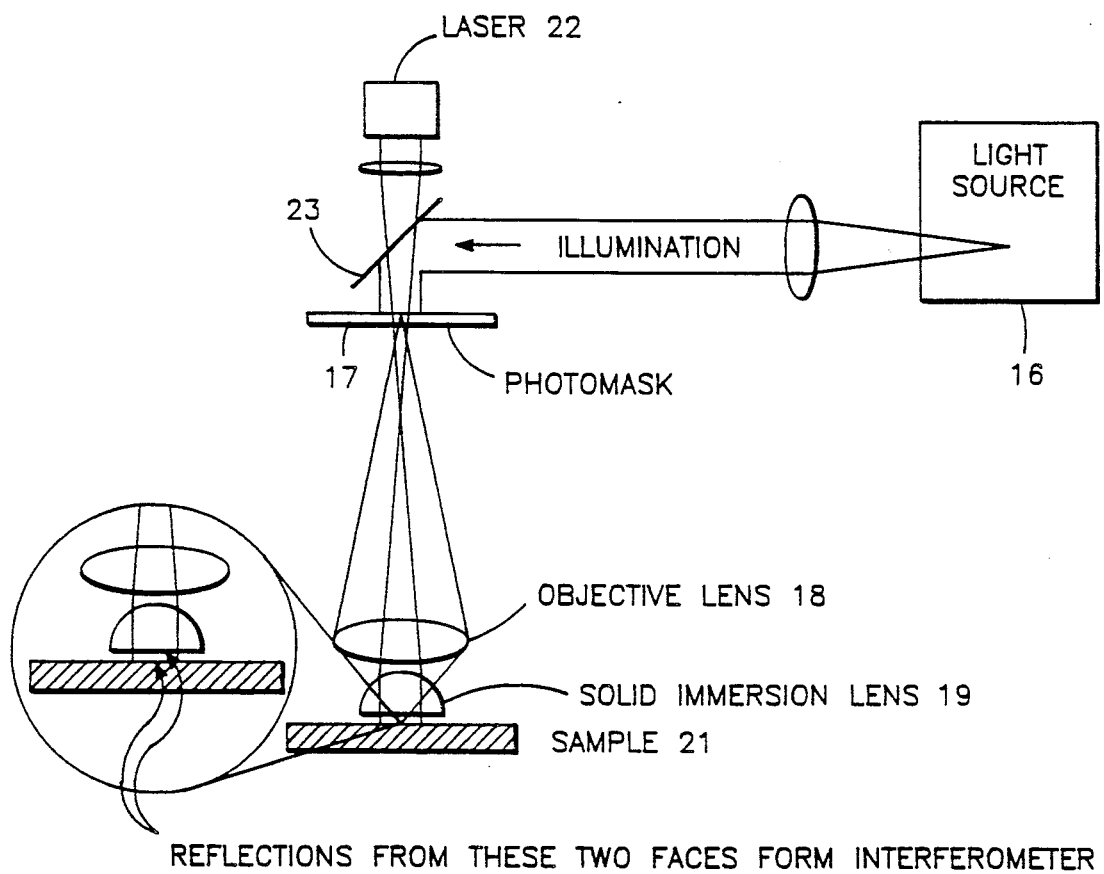
FIG. 4 is a simplified schematic diagram of a projection lithography system incorporating an SIL and including means for sensing and controlling the distance between the SIL and the photoresist.

We propose an alternative technique of constructing an interferometer between the SIL and the sample. A laser 22 can be used to set up standing waves between the bottom surface of the SIL and the top surface of the sample as shown in FIG. 4. In one configuration the laser can be brought into the system through a beam splitter 23 in such a way as to produce plane waves in the region between the bottom of the SIL and the top of the sample. There will be interference between the laser light reflected from the bottom of the SIL and the top of the sample. A path difference of a quarter of a wavelength ($\lambda/4$) will cause the interference pattern to change from bright to dark so that controlling the distance between the SIL and the sample to a few nanometers should be easily achieved by sensing the reflected light with a photodiode or the like and using the output as the input to a control system. In this system, the wavelength of the laser should be long enough that it does not expose the photoresist.

In an alternative configuration, a "white light source" may be used in the interferometer. This source should be filtered so that wavelengths which may expose the photoresist are removed. If a white light source is used, interference fringes will only be detected when the SIL and the sample are in close proximity to each other. To place the SIL close to the sample, one would simply move it until interference fringes were observed and then use the interference fringes to accurately control the spacing.

Figures 1, 2:
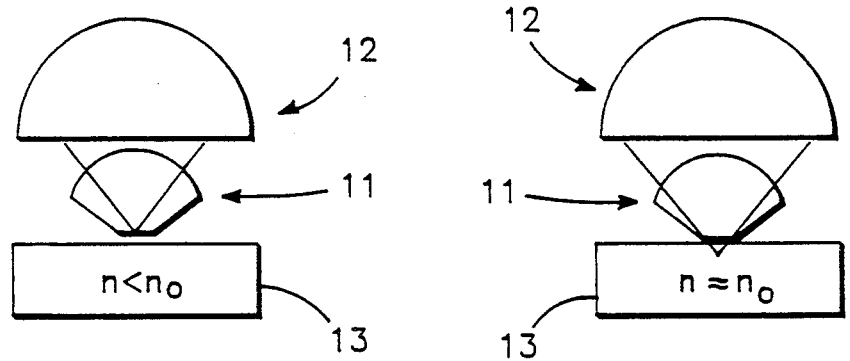
FIG. 1 illustrates the principles of an SIL operating in the near-field mode.
FIG. 2 illustrates the principles of an SIL operating in the internal imaging mode.

Since the improved definition of the SIL is achieved only very near its surface, thin photoresist must be used to transfer the pattern. Alternatively, for those applications requiring thicker photoresist, a multilayered resist with the photosensitive compound comprising the top thin layer may be used. To print patterns in thicker single layer photoresist, the SIL can be constructed out of a material with the same refractive index as the photoresist, as illustrated in FIG. 2. This lens should allow good aberration-free focusing inside the photoresist.

Figure 5:
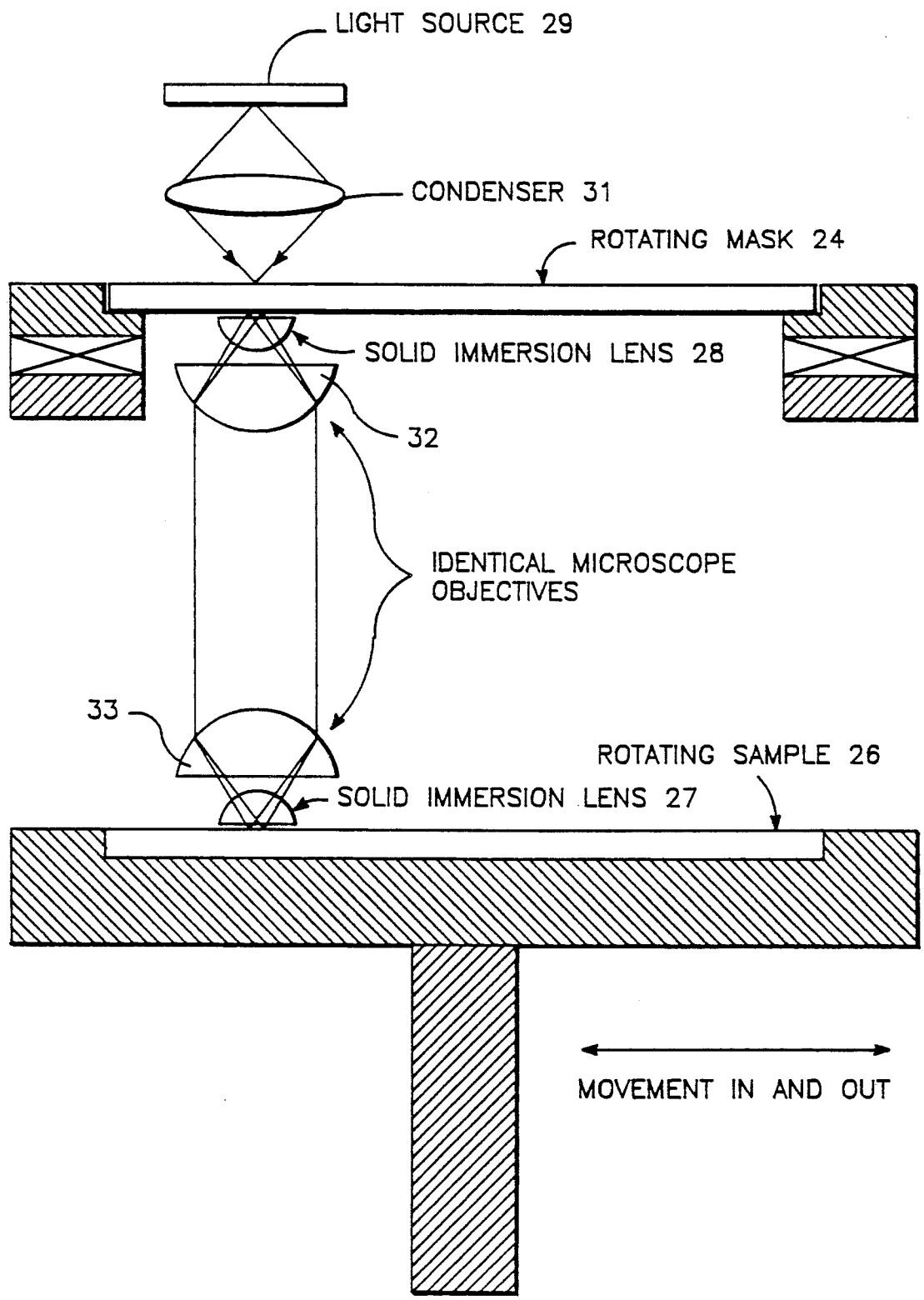
FIG. 5 is a simplified diagram of a rotating photolithography system incorporation two SIL's.

A second embodiment of this invention is to rotate a circularly shaped mask 24 and a silicon or other sample 26, cut into a circular shape which carries the photoresist, using the same center of rotation. One possible configuration is shown in FIG. 5. The basic idea of the system is to planarize the rotating sample 26 using standard methods well known in the semiconductor industry, and to use a floating solid immersion lens 27 floating on an air bearing, as is standard in magnetic disc recording, just above the sample as it is rotated at high speed. A floating SIL 28 is placed just below the mask 24. This procedure automatically maintains the spacing between the SIL and the sample. As the sample or mask begins to rotate at high speed, the SIL floats close to the rotating disc.

Figure 6:
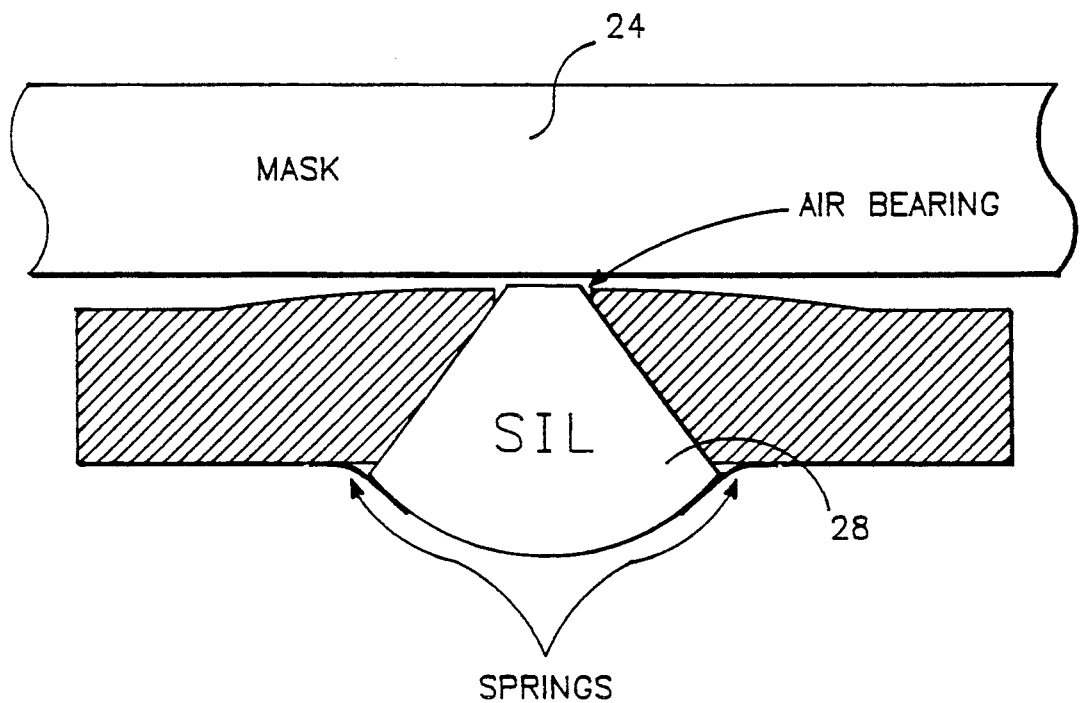
FIGS. 6 and 7 show floating mountings for SIL's.
Figure 7:
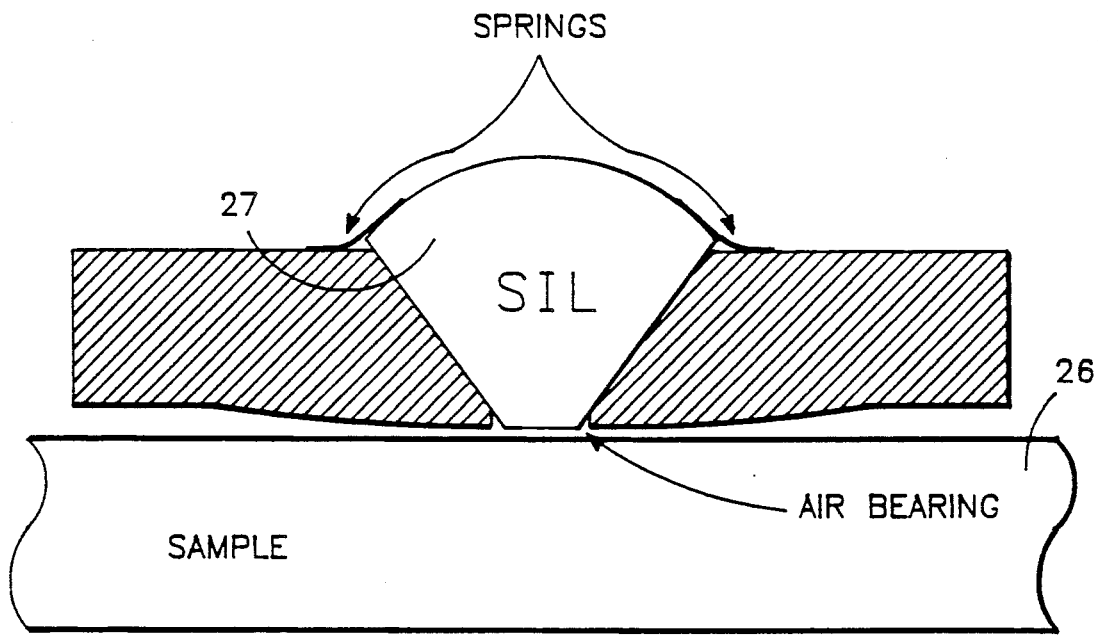

The SIL can be hemispherical in shape, and may have peripheral attachments to it to act as air guides (FIGS. 6 and 7). Most commonly, it is preferable to work with a small area of the SIL region just above the sample, and thus make the SIL conical in shape. Referring to FIGS. 6 and 7, a minimum of two springs 36, and preferably three springs, must be used to keep the SIL 27, 28 in place, the angle of the cone must be made sufficiently large so that the outer rays of the optical beam are not intercepted by the springs.

The two discs, the sample and the mask are made circular so as to avoid mechanical vibration. They are rigidly mechanically coupled so that they rotate together in unison. Light from an illuminating source 29 passes through condenser lens 31 and through the mask 24 to a wide aperture objective lens 32 with a field of view which may be one cell or a small part of one cell on the mask. In the example, a microscope lens with an infinite tube length is used, although the system could be easily adapted to lenses with a finite tube length. The beam emerging from the back of the microscope objective passes into a similar objective lens 33 and is imaged on the sample. Typically, the sample would be covered with photoresist. For optimum definition, a thin photoresist such as a Langmuir-Blodgett film of PMMA a few molecules thick could be used.

For example, if the two discs rotate at a rate of the order of 2000 rpm and the axis of the scan is moved across the lenses in a rectilinear direction (or the lenses are moved) at a rate of approximately 20 $\mu$m per revolution. For a rotation rate of 2400 rpm, or 40 rps, the translation rate required 800 $\mu$m/s. Since the field of view will be a minimum of 50 $\mu$m $\times$ 50 $\mu$m, there will be considerable interlacing of the scan, and hence no steps in the image. An 8" wafer would therefore take approximately 120 seconds, or two minutes, to expose.

The advantages of this system are that it can use wide aperture lenses along with near-field imaging. With an 0.8 aperture lens and a solid immersion lens with a refractive index of 2, we could expect spot sizes of the order of $$\frac{\lambda}{2.5 N.A.}$$

or $\lambda/2$. Thus, working with 365 nm light, one could expect to obtain line widths of better than 180 nm. The use of diamond (n =2.4) or other higher refractive index materials for the SIL would make it possible to obtain definitions of 150 nm, the gate width said to be required for integrated circuits in the year 2000. The system would be relatively inexpensive because of the light sources that could be employed along with the conventional microscope lenses used. It would obviously perform better if used with a far ultraviolet source and ultraviolet lenses.

What is claimed is:

1. In a lithography system of the type which includes a lens system for imaging a mask onto a sample, the improvement comprising placing a solid immersion lens placed closely adjacent to the sample, said solid immersion lens being constructed of a material having a high refractive index and shaped with a spherical surface facing said lens system and a flat front surface adjacent to said sample.

2. The improvement in claim 1 in which said lens system includes an objective lens and the solid immersion lens is placed between the objective lens and the sample.

3. The improvement in claim 1 in which the solid immersion lens is mounted for vertical movement and said lens and sample are rapidly moved relative to each other whereby the solid immersion lens is spaced from the sample by an air bearing.

4. The improvement in claim 1 including a light source for establishing an interference pattern between light reflected from the flat surface of the solid immersion lens and the sample and means responsive to the interference pattern for controlling the spacing between the solid immersion lens and the sample.

* * * * *